United States Patent [19]

Braden

[11] Patent Number: 4,893,032

[45] Date of Patent: Jan. 9, 1990

[54] NON-SATURATING TEMPERATURE INDEPENDENT VOLTAGE OUTPUT DRIVER WITH ADJUSTABLE DOWN LEVEL

[75] Inventor: James J. Braden, Endicott, N.Y.

[73] Assignee: International Business Machines Corp., Armonk, N.Y.

[21] Appl. No.: 368,971

[22] Filed: Jun. 20, 1989

Related U.S. Application Data

[63] Continuation of Ser. No. 28,992, Mar. 23, 1987, abandoned.

[51] Int. Cl.$^4$ ................. H03K 19/088; H03K 19/013
[52] U.S. Cl. ..................................... 307/456; 307/300; 307/310; 307/270; 323/907
[58] Field of Search ............... 307/456, 300, 310, 270; 323/907, 313

[56] References Cited

U.S. PATENT DOCUMENTS

| | | | |
|---|---|---|---|
| 3,999,080 | 12/1976 | Weathersby, Jr. et al. | 307/300 |
| 4,131,808 | 12/1978 | Kuo | 307/270 |
| 4,277,703 | 7/1981 | Wada et al. | 307/553 |
| 4,315,209 | 2/1982 | Schmoock | 323/907 |
| 4,330,723 | 5/1982 | Griffith | 307/456 |
| 4,376,900 | 3/1983 | Metzger | 307/300 |
| 4,449,063 | 5/1984 | Ohmichi et al. | 307/456 |
| 4,458,162 | 7/1984 | Solomon et al. | 307/456 |
| 4,459,540 | 7/1984 | Hayashi | 373/907 |
| 4,533,839 | 8/1985 | Balakrishnan | 307/270 |
| 4,628,247 | 12/1986 | Rossetti | 323/907 |

OTHER PUBLICATIONS

Widlar, R., "New Developments in IC Voltage Regulators", IEE J. Solid State Circuits, vol. SC-6, pp. 2-7, Feb. 1971, pp. 150-155.

*Primary Examiner*—Stanley D. Miller
*Assistant Examiner*—Nancy Thai
*Attorney, Agent, or Firm*—Mark Levy; Richard E. Bee

[57] ABSTRACT

A non-saturating voltage output driver circuit. A controlling mechanism is connected to a current source, a reference voltage and a load. A pre-driver is also connected to the current source. Connected to the controlling mechanism, the pre-driver and the load is a down-level output driver, the output of which is dependent on the reference voltage, but kept out of saturation and substantially constant over a temperature range.

3 Claims, 1 Drawing Sheet

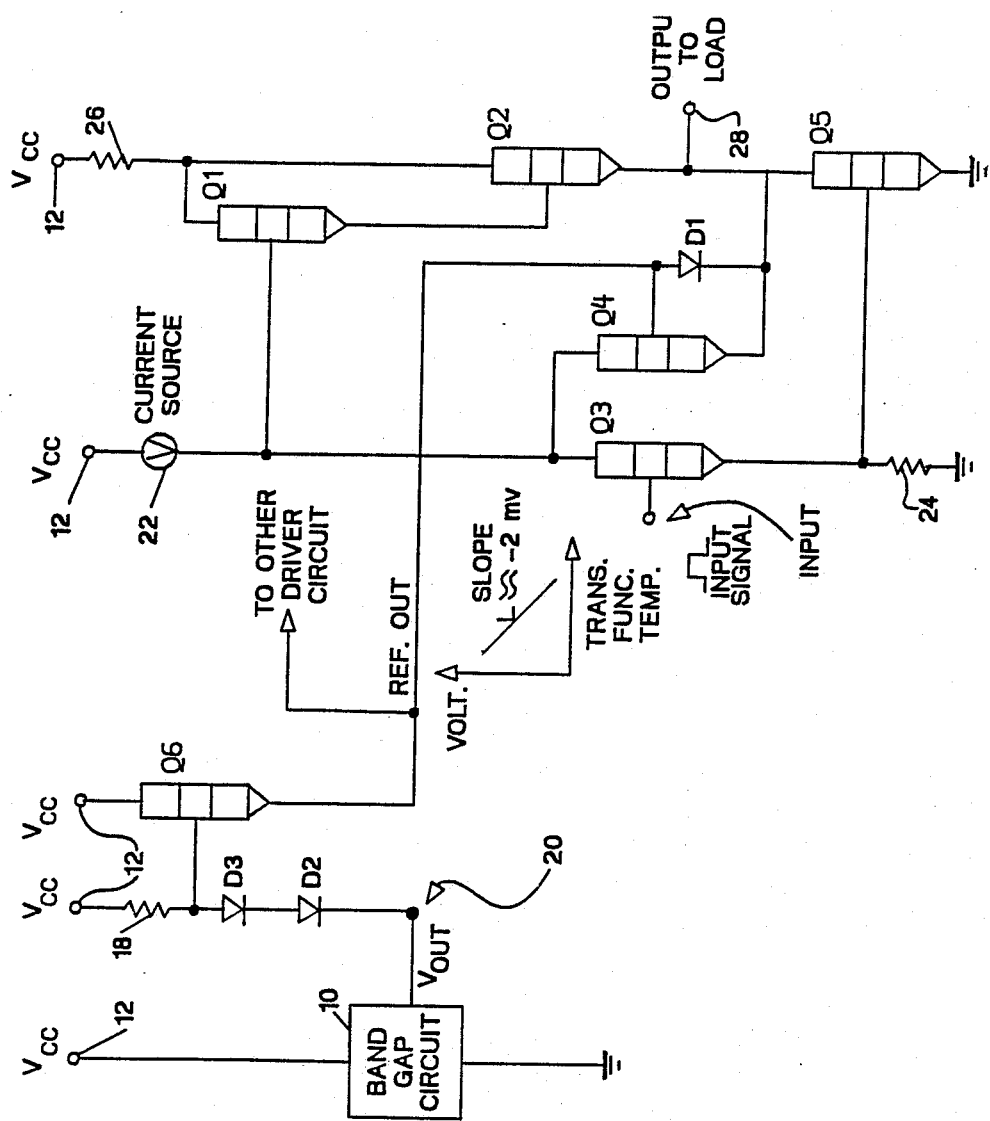

NON-SATURATING TEMPERATURE INDEPENDENT VOLTAGE OUTPUT DRIVER WITH ADJUSTABLE DOWN LEVEL

This is a continuation of co-pending application Ser. No. 07/028,992 filed on Mar. 23, 1987, now abandoned.

BACKGROUND OF THE INVENTION

The present invention relates to a transistor transistor logic (TTL) driver circuit capable of producing a down-level and particularly to a TTL driver circuit that operates efficiently without the use of Schottky diodes.

A saturated state of conduction occurs when the collector voltage of a transistor reaches a sufficiently low level relative to the transistor base. When current is applied to the base of a conventional transistor, the voltage differential between the base to the emitter is 0.7 or 0.8 volts. A collector to emitter voltage drop of approximately 0.8 volts generally indicates the onset of saturation; 0.4 volts generally indicates saturation; and 0.2 volts is conventionally known as deep saturation. When saturation occurs, the gain of the transistor decreases. That is, a greater amount of current must be applied to the base in order to allow a predetermined relatively high current to flow from the collector to the emitter. Moreover, if a transistor is driven into saturation—and especially into deep saturation—when current is no longer applied to the base of the transistor, the time constant thereof changes so that the device does not shut off rapidly. The rate at which the transistor is shut off is called its switching speed. Decreased switching speeds of circuit devices necessarily result in circuit propagation delays. Such delays cannot be tolerated in many high speed electronic applications.

Saturation occurs when no clamp exists in the circuit between the base and collector of a transistor. A 0.3 volt Schottky diode clamp connected across the base-collector junctions allows current to flow through the diode, stabilizing the transistor so that, in the case of a 0.8 volt base to ground transistor for example, the collector is held substantially constant at approximately 0.5 volts and saturation is prevented.

Although Schottky diode clamps can prevent transistors from being driven into saturation over a relatively normal temperature range, when extreme temperature ranges are encountered, even Schottky devices may not perform adequately. In certain operating environments, integrated circuit chips that contain these driver circuits may be subjected to a range of temperature of 100° C. or more. Such extreme temperature ranges can occur due to external factors, the heat generated by circuit components themselves, or a combination of both. Moreover, when a Schottky device is not available, temperature compensation requirements are exacerbated.

Heretofore a so-called Baker clamp circuit has been used in conjunction with transistors in order to stabilize or prevent saturation thereof. Such a clamp circuit comprises two diodes in parallel, both anodes being connected to one another and therefore having the same voltage potential. One cathode is connected to the base of the transistor, the other cathode being connected to its collector. Both of these diodes have the same voltage drop characteristics, so that the base and collector are constantly held at the same voltage potential. Extreme temperature variance during operation, however, can be a significant problem, not addressed by Baker clamps.

U.S. Pat. No. 4,533,839 issued to Balakrishnan discloses a switching output transistor in a peripheral driver circuit. The transistor is provided with a shut off circuit which turns the output transistor off when its collector supply current exceeds its saturation current. Thus, the transistor is shut off upon saturation, but no attempt is made to prevent saturation.

U.S. Pat. No. 4,277,703 issued to Wada et al. teaches the use of a level clamp circuit in conjunction with a positive feedback circuit. The level clamp circuit is coupled to the collector of a transistor in order to hold the collector output potential of the transistor higher than the base input potential thereof. Such a circuit, however, makes no allowance for temperature compensation.

U.S. Pat. No. 4,376,900 issued to Metzger teaches the use of a bipolar transistor logic circuit requiring the use of ten transistors. Certain of these transistors are prevented from being driven into saturation, but a temperature compensation mechanism is not incorporated.

U.S. Pat. No. 3,999,080 issued to Weathersby, Jr. et al. teaches the use of TTL logic with PNP input transistors to reduce loading on input drive devices. Internal clamping with p-n diode junctions prevent transistor saturation. Once again, however, temperature compensation is not addressed.

It would be advantageous to provide a circuit capable of compensating for extreme variations in temperature.

It would be advantageous to provide a non-saturating driver that would emulate a Schottky device clamp.

It would also be advantageous to provide a driver circuit in which the collector voltage of the driving transistor is kept just below the base voltage to prevent deep saturation thereof.

It would also be advantageous to provide a driver circuit in which the collector down-level voltage of the driving transistor could be adjusted by adjusting a band gap circuit voltage.

It would be advantageous to compensate for temperature in a driver circuit without using Schottky devices over very great ranges of temperature (e.g., −10° C. to 100° C.

SUMMARY OF THE INVENTION

In accordance with the present invention, there is provided a non-saturating voltage output driver circuit. A controlling mechanism is connected to a current source, a reference voltage and a load. A pre-driver is also connected to the current source. Connected to the controlling mechanism, the pre-driver and the load is a down-level output driver, the output of which is dependent on the reference voltage, but kept out of saturation and substantially constant over a temperature range.

BRIEF DESCRIPTION OF THE DRAWING

A complete understanding of the present invention may be obtained by reference to the accompanying drawing, when taken in conjunction with the detailed description thereof and in which:

FIG. 1 is a schematic diagram of the circuit in accordance with the present invention.

DETAILED DESCRIPTION OF THE PREFERRED EMBODIMENT

Referring now to FIG. 1 there is shown a schematic in accordance with the preferred embodiment of the present invention.

FIG. 1 shows a typical TTL driver with the additions of controller elements transistor Q4 and diode D1 and a temperature compensated voltage reference circuit shown generally at reference numeral 20.

A band gap reference circuit 10 is connected to a voltage source $V_{cc}$ 12 and to ground. The band gap reference circuit 10 is capable of sinking collector current. Many types of band gap reference circuits can be used, but an exemplary circuit is described by R. J. Widlar in "New Developments in IC Voltage Regulators", IEEE Journal of Solid State Circuits, Vol. SC-6, pp. 2-7, Feb. 1971. The band gap reference circuit 10 is a conventional circuit for use in environments in which temperature varies. Constant voltage is output $V_{out}$ by the circuit 10 regardless of temperature variance.

The voltage output $V_{out}$ from the band gap circuit 10 is applied to the cathode of a first diode D2, the anode of which is connected to the cathode of a second diode D3. The anode of the second diode D3 is connected to the voltage source $V_{cc}$ 12 via a resistor 18.

The base of a transistor Q6 is connected to the anode of the second diode D3. The collector of the transistor Q6 is also connected to the voltage source $V_{cc}$ 12. The emitter of the transistor Q6 is applied to one or more driver circuits as hereinafter described.

The reference voltage REF. OUT generated at the emitter of transistor Q6 is applied to the anode of diode D1 and to the base of a transistor Q4. A current source 22 is connected to the voltage supply $V_{cc}$ 12, to the collector of a pre-driver transistor Q3, to the collector of transistor Q4 and, optionally, to a Darlington pair of transistors Q1 and Q2, which functions as an up-level driver.

The emitter of pre-driver transistor Q3 is connected to the base of driver transistor Q5. An input to the pre-driver transistor Q3 is applied to the base thereof. The emitter of the pre-driver transistor Q3 is also grounded via a resistor 24. Another resistor 26 is connected to the voltage source $V_{cc}$ 12 and to the collectors of the Darlington pair of transistors Q1 and Q2. A load, such as another TTL circuit, is connected to the collector of driver transistor Q5, via port 28.

In operation, the band gap reference circuit 10 produces a constant voltage over a variation of 23 temperatures. Its output $V_{out}$ is connected to diode D2. This temperature controlling diode D2 compensates the variations in temperatures of the driver stage. Diode D2 is in turn connected to diode D3, which removes the temperature variation from the emitter of transistor Q6. Resistor 18 limits the current to diodes D2 and D3.

Transistor Q6 supplies an output voltage REF. OUT that changes with temperature as does the voltage drop across diode D1. This voltage REF. OUT at the emitter of transistor Q6 is applied to the diode D1 to control the output voltage in the down-level to be a specific voltage over varying temperature. When the temperature in the circuit increases, the output voltage of the reference circuit decreases to compensate the decreasing diode D1 voltage to produce an output in the down-level that is substantially constant over a temperature range. Similarly, for decreasing circuit temperatures, the output of the reference circuit increases as the voltage across diode D1 increases.

A temperature compensated voltage is thus produced at the output of the driver in the down-level. An up-level voltage on the input of transistor Q3 produces current through transistor Q3 that is applied to the base of the output driver transistor Q5. Without the use of the present invention, this transistor Q5 would normally be driven into saturation. The current passes through diode D1 and transistor Q4. These two devices D1 and Q4 are the controlling elements keeping the collector of driver transistor Q5 out of saturation.

The temperature compensated band gap circuit 10 is designed for a voltage at reference numeral 20 equal to the required down-level output voltage at port 28 plus about 0.5 volts at room temperature. This combination of voltages produces an output down-level drive voltage of approximately 0.5 volts at the output of driver transistor Q5. The output voltage REF. OUT decreases about 2 millivolts per degree Centigrade increase to track and to compensate the voltage change across the diode D1. This temperature tracking produces a substantially constant voltage at the output port 28. Diode D1 and transistor Q4 are the same type devices and are preferably adjacent one another for good matching characteristics.

While the circuit without transistor Q4 would give fair control of the down-level output, the current would be higher through diode D1 at higher temperatures because the current gain (beta) of transistors Q5 and Q3 would be higher.

Transistor Q4 diverts some current from the base of transistor Q5 to its collector to reduce the power in the circuit. Transistor Q4 also prevents transistor Q3 from being driven into saturation, therefore reducing its time constant and increasing its switching speed. When output port 28 is in the down-level, transistor Q4 and diode D1 are current splitting or current doubling devices. A current through diode D1 causes an equal current to flow through transistor Q4 to output port 28. During the up-level operation, both transistor Q4 and diode D1 are non-conducting because they are reverse biased.

The driver stage of transistors Q1 and Q2 are connected in a Darlington pair. They produce an up-level drive if needed, but are not necessary for operation of the circuit. If the circuit is used as an open collector type transistor circuit, transistors Q1 and Q2 could be eliminated. When a low level voltage is applied to the base of transistor Q3, the transistor Q3 is in the OFF state. The current from the current source 22 passes through the base of transistor Q1 and the base of transistor Q2 producing an up-level at the output port 28.

It can thus be seen that a Schottky type driver circuit has been disclosed without the use of Schottky device clamps and in which output voltage is substantially constant over a broad range of temperature and can be adjusted to any voltage required by adjusting the band gap circuit 10 $V_{out}$.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed is:
1. A non-saturating output driver circuit comprising:
   a supply voltage source;
   a supply voltage return;
   a resistor having one end coupled to the supply voltage return;
   an input transistor having first and second primary terminals and a control terminal, the first primary terminal being coupled to the supply voltage source, the second primary terminal being coupled to the other end of the resistor and the control terminal receiving an input signal;

an output transistor having first and second primary terminals and a control terminal, the first primary terminal supplying an output signal to a load, the second primary terminal being coupled to the supply voltage return and the control terminal being coupled to the second primary terminal of the input transistor;

a temperature compensation voltage reference circuit having an output terminal for supplying a reference voltage which varies in a predetermined manner with temperature;

and a saturation control diode mechanism having first and second primary terminals, the first primary terminal being coupled to the output terminal of the temperature compensation voltage reference circuit and the second primary terminal being coupled to the first primary terminal of the output transistor;

whereby the saturation control diode mechanism functions to minimize saturation of the output transistor and the temperature compensation voltage reference circuit functions to minimize temperature produced variations in down-level voltage at the first primary terminal of the output transistor.

2. A non-saturating output driver circuit comprising:

a supply voltage source;

a supply voltage return;

a resistor having one end coupled to the supply voltage return;

an input transistor having first and second primary terminals and a control terminal, the first primary terminal being coupled to the supply voltage source, the second primary terminal being coupled to the other end of the resistor and the control terminal receiving an input signal;

an output transistor having first and second primary terminals and a control terminal, the first primary terminal supplying an output signal to a load, the second primary terminal being coupled to the supply voltage return and the control terminal being coupled to the second primary terminal of the input transistor;

a temperature compensation voltage reference circuit having an output terminal for supplying a reference voltage which varies in a predetermined manner with temperature;

a saturation control diode mechanism having first and second primary terminals, the first primary terminal being coupled to the output terminal of the temperature compensation voltage reference circuit and the second primary terminal being coupled to the first primary terminal of the output transistor;

and a saturation control transistor having first and second primary terminals and a control terminal, the first primary terminal being coupled to the supply voltage source, the second primary terminal being coupled to the first primary terminal of the output transistor and the control terminal being coupled to the first primary terminal of the saturation control diode mechanism;

whereby the saturation control diode mechanism and the saturation control transistor function to minimize saturation of the output transistor and the temperature compensation voltage reference circuit functions to minimize temperature produced variations in down-level voltage at the first primary terminal of the output transistor.

3. A non-saturating output driver circuit comprising:

a supply voltage source;

a supply voltage return;

a resistor having one end connected to the supply voltage return;

an input transistor having an emitter, a base and a collector, the collector being coupled to the supply voltage source, the emitter being connected to the other end of the resistor and the base receiving an input signal;

an output circuit having first and second terminals with the first terminal being connected to the supply voltage source;

an output transistor having an emitter, a base and a collector, the collector being connected to the second terminal of the output circuit and supplying an output signal to a load, the emitter being connected to the supply voltage return and the base being connected to the emitter of the input transistor;

a temperature compensation voltage reference circuit having an output terminal for supplying a reference voltage which varies in a predetermined manner with temperature;

a saturation control diode having an anode and a cathode, the anode being connected to the output terminal of the temperature compensation voltage reference circuit and the cathode being connected to the collector of the output transistor;

and a saturation control transistor having an emitter, a base and a collector, the collector being coupled to the supply voltage source, the emitter being connected to the collector of the output transistor and the base being connected to the anode of the saturation control diode;

whereby the saturation control diode and the saturation control transistor function to minimize saturation of the output transistor and the temperature compensation voltage reference circuit functions to minimize temperature produced variations in down-level voltage at the collector of the output transistor.

* * * * *